(12) United States Patent
Chidambaram et al.

(10) Patent No.: US 7,122,435 B2
(45) Date of Patent: Oct. 17, 2006

(54) METHODS, SYSTEMS AND STRUCTURES FOR FORMING IMPROVED TRANSISTORS

(75) Inventors: PR Chidambaram, Richardson, TX (US); Haowen Bu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 15 days.

(21) Appl. No.: 10/909,515

(22) Filed: Aug. 2, 2004

(65) Prior Publication Data
US 2006/0024876 A1 Feb. 2, 2006

(51) Int. Cl.
*H01L 21/336* (2006.01)

(52) U.S. Cl. ............ 438/303; 438/308; 438/230; 438/530; 257/336; 257/E21.435

(58) Field of Classification Search ........... 438/481, 438/303, 308, 230, 530; 257/336, E21.435
See application file for complete search history.

(56) References Cited

U.S. PATENT DOCUMENTS

| | | | | |
|---|---|---|---|---|
| 5,970,353 | A * | 10/1999 | Sultan | 438/302 |
| 6,358,806 | B1 * | 3/2002 | Puchner | 438/308 |
| 6,492,216 | B1 * | 12/2002 | Yeo et al. | 438/197 |
| 6,563,152 | B1 * | 5/2003 | Roberds et al. | 257/288 |
| 6,621,131 | B1 * | 9/2003 | Murthy et al. | 257/408 |
| 6,638,802 | B1 * | 10/2003 | Hwang et al. | 438/197 |
| 6,683,802 | B1 * | 1/2004 | Katoh | 365/145 |
| 6,900,502 | B1 * | 5/2005 | Ge et al. | 257/347 |
| 2002/0086502 | A1 * | 7/2002 | Liu et al. | 438/430 |
| 2003/0146494 | A1 * | 8/2003 | Puchner et al. | 257/616 |
| 2004/0026765 | A1 * | 2/2004 | Currie et al. | 257/616 |
| 2004/0262683 | A1 * | 12/2004 | Bohr et al. | 257/338 |
| 2005/0029601 | A1 * | 2/2005 | Chen et al. | 257/369 |
| 2005/0035470 | A1 * | 2/2005 | Ko et al. | 257/900 |
| 2005/0082616 | A1 * | 4/2005 | Chen et al. | 257/350 |
| 2005/0087801 | A1 * | 4/2005 | Lindert et al. | 257/330 |
| 2005/0179066 | A1 * | 8/2005 | Murthy et al. | 257/288 |
| 2006/0003561 | A1 * | 1/2006 | Goktepeli | 438/528 |

OTHER PUBLICATIONS

Wolf, "Silicon Processing for the VLSI Era: Process Technology," vol. 1, 1986, pp. 303-308.*
Wolf, "Silicon Processing for the VLSI Era: The Submicron MOSFET," vol. 3, 1995, pp. 588-592.*
"Transistor Device Containing Carbon Doped Silicon in a Recess Next to MDD to Create Strain in Channel", U.S. Appl. No. 10/877,154; filed Jun. 25, 2004, 34 pages.

* cited by examiner

*Primary Examiner*—Bradley K. Smith
*Assistant Examiner*—Steven J. Fulk
(74) *Attorney, Agent, or Firm*—Rose Alyssa Keagy; W. James Brady; Frederick J. Telecky, Jr.

(57) ABSTRACT

A method (100) of forming a transistor includes forming a gate structure (106, 108) over a semiconductor body and forming recesses (112) substantially aligned to the gate structure in the semiconductor body. Amorphous silicon regions are then formed (114) in the recesses. The amorphous silicon regions are re-crystallized. Sidewall spacers are formed (118) over lateral edges of the gate structure. The method continues by implanting source and drain regions in the semiconductor body (120) after forming the sidewall spacers. The re-crystallized silicon regions formed in the recesses reside close to the transistor channel and serve to facilitate improved carrier mobility in NMOS type transistor devices.

18 Claims, 11 Drawing Sheets

METHODS, SYSTEMS AND STRUCTURES FOR FORMING IMPROVED TRANSISTORS

FIELD OF INVENTION

The present invention relates generally to semiconductor devices and more particularly to FET transistors and associated methods of manufacture having improved drain/source structures.

BACKGROUND OF THE INVENTION

A conventional field effect transistor (FET), also known as a metal oxide semiconductor (MOS) transistor, generally includes a semiconductor substrate, such as silicon, having a source, a drain, and a channel positioned between the source and drain. A gate stack composed of a conductive material (a gate conductor), an oxide layer (a gate oxide), and sidewall spacers, is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus the higher the mobility of the carriers in the channel, the more current can flow and the faster a circuit can perform. One way to increase the mobility of the carriers in the channel of an MOS transistor is to produce a mechanical stress in the channel.

A compressive strained channel, such as a silicon-germanium channel layer grown on silicon, has significant hole mobility enhancement. A tensile strained channel, such as a thin silicon channel layer grown on relaxed silicon-germanium, achieves significant electron mobility enhancement. The most common method of introducing tensile strain in a silicon channel region is to epitaxially grow the silicon channel layer on a relaxed silicon-germanium (SiGe), layer or substrate. The ability to form a relaxed SiGe layer is important in obtaining an overlying, epitaxially grown, silicon layer under biaxial tensile strain, however the attainment of the relaxed SiGe layer can be costly and difficult to achieve.

Another method of obtaining a tensile strain in the channel is to epitaxially grow a SiC layer over the entire active area. A disadvantage of this method is that carbon within the channel portion of the strain layer can migrate into the overlying gate oxide, thereby causing a relatively large interface trap density (DIT), which disadvantageously increases scattering and reduces the mobility advantages associated with the strained channel. Another important issue with this approach is the problem of getting the C atoms in substitutional lattice site in silicon. For the strain to manifest, the C atoms should be in substitutional sites.

Many different source and drain doping methodologies and profiles have been used to modify the operating characteristics of FETs. Lightly- and mildly-doped drain regions (LDD and MDD, respectively) and extensions have been used to adjust the structure and operation of an FET. Pocket dopant implantations proximate the channel regions have similarly been used to affect device structure and operation. Buried regions, different types of dopant implantation processes and materials, different annealing process parameters and other well-known process and material variations have all been used with varying degrees of success to adjust the operating characteristics of FETs. It is believed that these P- and N-type dopants affect the semiconductor properties of the silicon by affecting the mobility and flow of electrons within the silicon crystal lattice structure.

It would be advantageous to have a transistor device and method that effectively and reliably provides strain to the device in order to improve carrier mobility.

SUMMARY OF THE INVENTION

New and improved methods and systems are provided for forming strain in selected semiconductor device regions to improve the operation of the devices.

In one embodiment of the invention there is provided a method of forming a transistor, comprising: forming a gate structure over a semiconductor body; forming amorphous regions of silicon doped with a Group IVa element aligned to the gate structure in the semiconductor body; re-crystallizing the amorphous regions of silicon to form doped crystalline regions; and implanting source and drain regions in the doped crystalline regions.

In another embodiment there is provided a method of forming an NMOS and a PMOS transistor concurrently, comprising: forming a gate structure over a semiconductor body in an NMOS region and a PMOS region, respectively; forming recesses substantially aligned to the gate structures in the semiconductor body in both the NMOS and PMOS regions; forming amorphous regions of silicon doped with a Group IVa element in the recesses; crystallizing the amorphous regions of silicon to form crystallized regions of silicon; forming sidewall spacers over lateral edges of the gate structures; and implanting n-type source and drain regions in the NMOS region and p-type source and drain regions in the PMOS region of the semiconductor body after forming the sidewall spacers.

BRIEF DESCRIPTION OF THE DRAWINGS

These and other objects, features and advantages of the invention will be apparent from a consideration of the following detailed description of the invention when read in conjunction with the drawing Figures, in which.

DETAILED DESCRIPTION OF THE INVENTION

One or more implementations of the present invention will now be described with reference to the attached drawings, wherein like reference numerals are used to refer to like elements throughout, and wherein the illustrated structures are not necessarily drawn to scale. The invention provides transistor structures and methods exhibiting improved operating characteristics in which it is theorized that transistor mobility is improved while minimizing defects heretofore associated with conventional strained silicon device solutions.

The present inventors have determined that the operation of an FET is improved through manufacture and structure in accordance with the invention described below. While the inventors theorize that the beneficial results of the invention are obtained through the substitution of dopant atoms at an atomic level for silicon atoms within the semiconductor crystal lattice structure, resulting in the inducement of strain and concomitantly enhanced carrier mobility, the invention is not limited by this theory. Numerous methods and structures in accordance with the present invention are taught below.

While the invention is described with respect to the use of carbon to form a silicon-carbon, SiC, lattice structure, the present inventors have determined that any of the elements in group IVa of the periodic table, including silicon, germanium, lead and tin will provide the same results.

Figure 1:
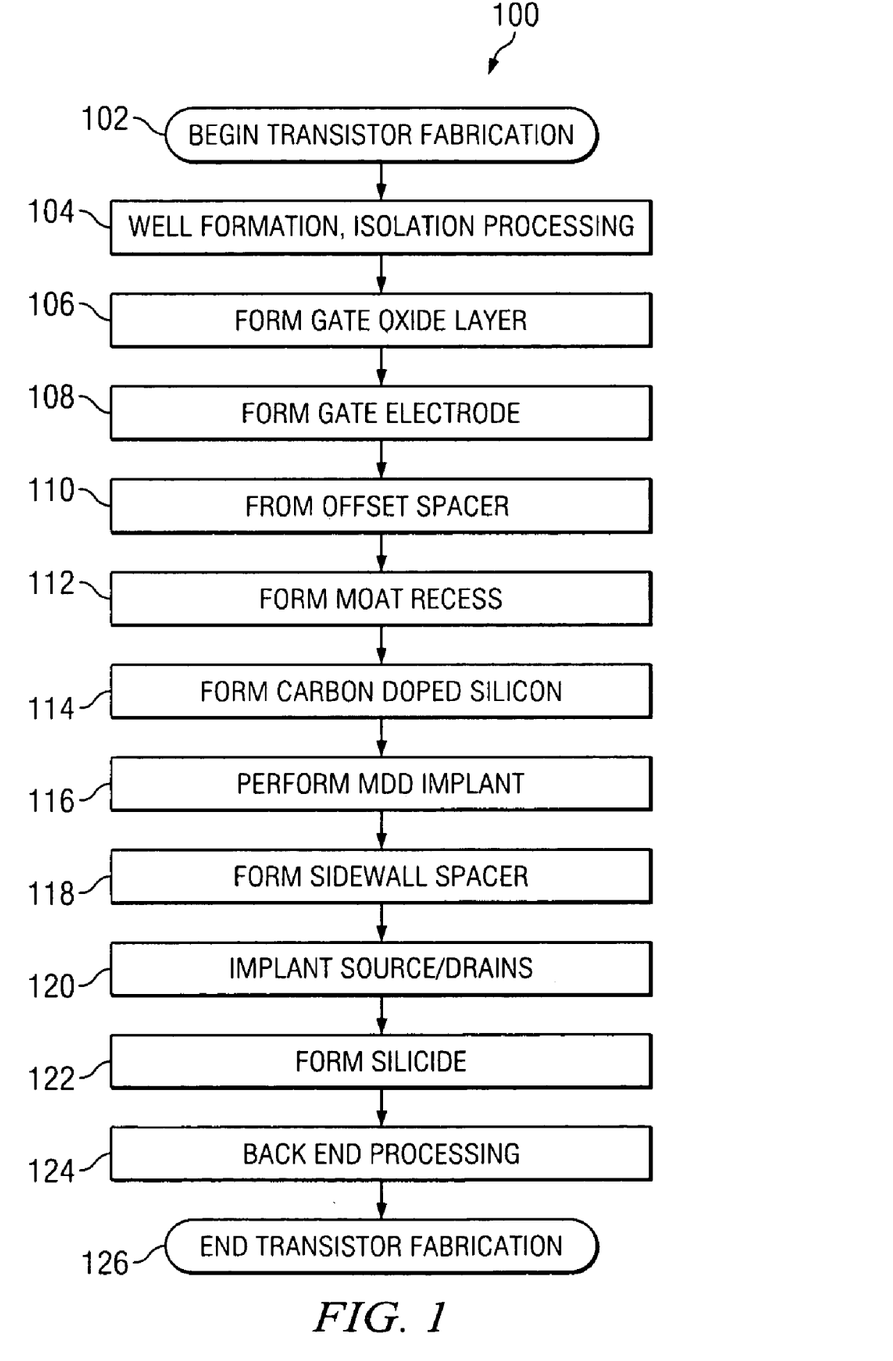
FIG. 1 is a flow chart illustrating a method of forming a transistor having improved mobility according to one aspect of the present invention.

Referring now to FIGS. 1 and 2A–2K, further aspects of the invention relate to methods of fabricating integrated circuits, wherein FIG. 1 illustrates an exemplary method 100 in accordance with the invention, and FIGS. 2A–2K illustrate the exemplary transistor device at various stages of fabrication in accordance with the invention. While the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of ICs and composite transistors illustrated and described herein, as well as in association with other transistors and structures not illustrated, including but not limited to NMOS and/or PMOS composite transistors.

The method 100 begins at 102, wherein transistor fabrication is initiated, and transistor well formation and isolation processing is performed at 104. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide regions (LOCOS) and/or other isolation structures that serve to define various active areas and electrically isolate various active areas laterally from one another.

The method 100 continues at 106, wherein a gate oxide layer is formed in active areas defined by the various formed isolation regions. In one example, the gate oxide comprises a thin, thermally grown silicon dioxide layer, however, other type gate dielectrics (such as high-k dielectrics) may be formed and are contemplated by the present invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively.

An offset spacer is then formed on lateral edges of the conductive gate electrodes at 110. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space the strain inducing material slightly away from the channel region under the gate, for example, a distance of about 10 nm to about 50 nm. A recess is then formed in the moat area extending between the gate structure and the isolation regions at 112. The moat area refers to the active region of the silicon body where extension regions and subsequently source/drain regions may be formed. The recess is formed using, for example, a dry etching process such as the chemistry employed to etch STI trenches in the semiconductor body when forming isolation regions. The recesses, in one example extend into the semiconductor body to a depth of about 30 nm to about 70 nm. In the present example, the gate structure is not masked during the recess formation; therefore if the gate electrode is composed of polysilicon, the recess formation process will also result in a recess formed in a top portion of the gate electrode material.

The method 100 then continues at 114, wherein carbon doped silicon is formed in the recesses. This is accomplished by a process of forming a silicon-carbon region within the recess, then amorphizing and re-crystallizing the amorphous region. As noted above, this is theorized to incorporate the carbon atoms meta-stably into the SiC crystal lattice structure on a substitutional level for the silicon atoms, causing the desired strain and increased carrier mobility.

In one embodiment of the invention, the strained SiC lattice structure is formed by epitaxially depositing SiC into the recess using a standard chemical vapor deposition (CVD) process, a low-pressure chemical vapor deposition (LPCVD), or a selective LPCVD process, at a temperature generally greater than about 6000 Centigrade. An appropriate conductivity-type dopant is then implanted, using conventional ion implantation techniques, into the epitaxial SiC, causing the SiC region to become amorphous. Appropriate dopants include indium, arsenic, germanium, antimony, boron and other known dopants used to affect the conductivity of silicon. The amorphous SiC region is subsequently permitted to re-crystallize.

In another embodiment of the invention, a gas cluster ion beam implantation process is used to deposit SiC in an amorphous form directly into the recess. The amorphous SiC is then permitted to re-crystallize. Further thermal processing in the standard CMOS flow will re-crystallize the amorphous layer.

An MDD or extension region implant is then performed at 116, wherein dopants are introduced into silicon doped carbon material in the recesses (both in the moat area as well as on a top portion of the gate electrode). For example, lightly doped, medium doped or heavily doped extension region implants are performed in the NMOS and PMOS regions, respectively, wherein the gate structure serves to self-align the extension regions. Since both the recesses (now filled with carbon doped silicon) and the extension region implants are formed after the offset spacer, both are self-aligned with respect to the offset spacer, thereby placing both regions extremely close to the lateral edge of the gate structure within the semiconductor body. A thermal process such as a rapid thermal anneal is then employed to activate the extension region dopants, which causes the extension regions to diffuse laterally slightly underneath the offset spacer toward the channels.

Still referring to FIG. 1, sidewall spacers are then formed on the gate structures at 118. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 80 nm. The source/drain regions are then formed by implantation at 120, wherein a source/drain dopant is introduced into the exposed areas (top of gate electrode and active areas not covered by sidewall spacers). The source/drain regions are then completed with a thermal process to activate the dopant.

The method 100 then concludes with silicide processing at 122, wherein a metal layer is formed over the device, followed by a thermal process, wherein the metal and silicon interfaces react to form a silicide (on top of the gate and in the source/drain regions). Unreacted metal is then stripped away, and back end processing such as interlayer dielectric and metallization layers are formed at 124 to conclude the device formation at 126.

Figure 2A:
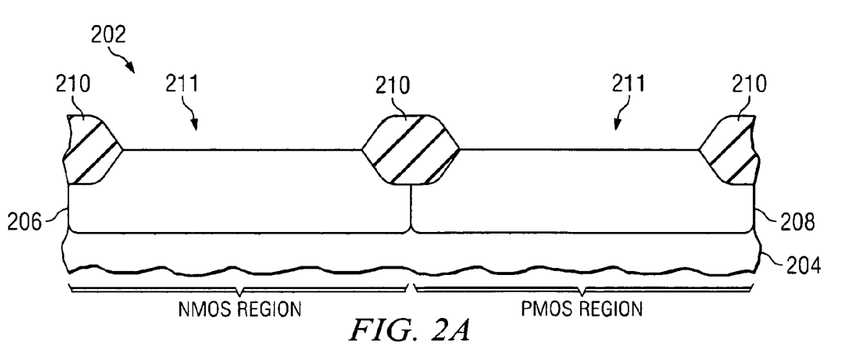
FIGS. 2A–2K are fragmentary cross section diagrams illustrating various steps of forming NMOS and PMOS transistors in accordance with the invention of FIG. 1.
Figure 2B:
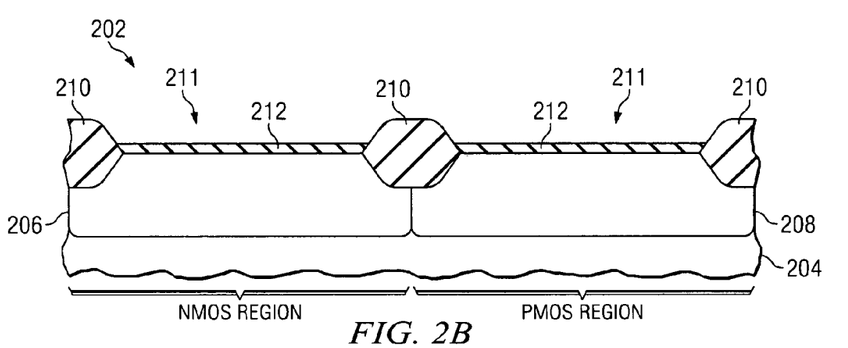

Turning now to FIGS. 2A–2K, a plurality of fragmentary cross section diagrams illustrating a transistor device being formed in accordance with the present invention of FIG. 1 is provided. In FIG. 2A, a transistor device 202 is provided, wherein a semiconductor body 204, such as a substrate, has a number of wells formed therein, such as a P-well 206 to define an NMOS transistor device region and an N-well 208 to define a PMOS transistor device region, respectively. Further, isolation regions 210 such as STI regions are formed in the semiconductor body to define active area regions 211, as may be appreciated. In FIG. 2B, the transistor device 202 is illustrated, wherein a gate oxide 212 has been formed, for example, thermally grown $SiO_2$, over the active areas 211.

Figure 2C:
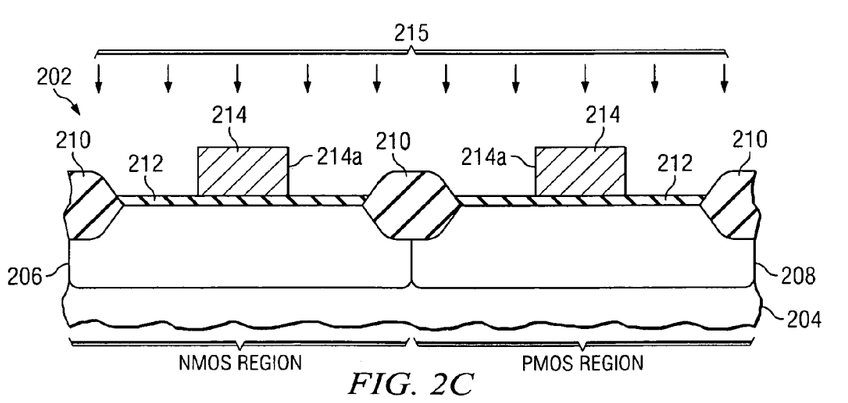
Figure 2D:
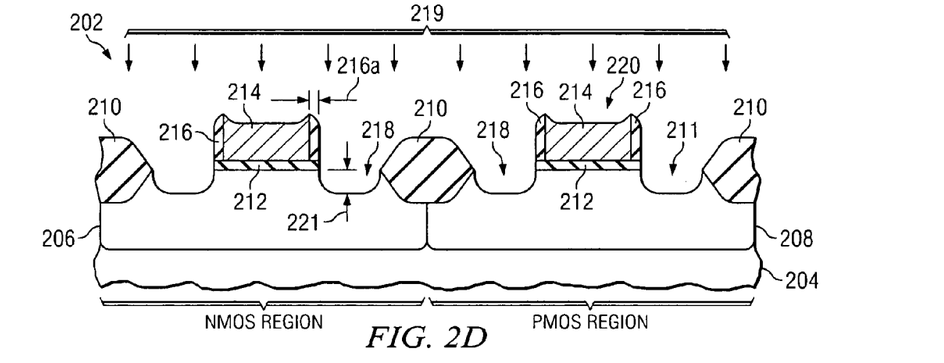

Referring to FIGS. 2C and 2D, a conductive gate electrode material (e.g., polysilicon) has been deposited and patterned via an etching process 215 to form a gate electrode 214 overlying the gate oxide 212. An offset spacer 216 is then formed on the lateral edges 214a of the gate electrode, wherein the offset spacers have a width 216a of about 10–50 nm. Recesses 218 are then formed in the active areas using an etch process 219, wherein the gate electrode 214 and isolations areas 210 serve as a mask. In the case where the gate electrode comprises polysilicon, the etch process 219 will also create a recess 220 in a top portion of the gate structure, as illustrated in FIG. 2D. The recesses 218 are formed into the semiconductor body to a depth 221 of about 30–70 nm, for example. Although the example illustrated herein has the recesses 218 formed after an offset spacer, such recesses may be formed prior to such a spacer, wherein in such instance the recesses 218 are aligned to the lateral edges 214a of the gate structures.

Figure 2E:
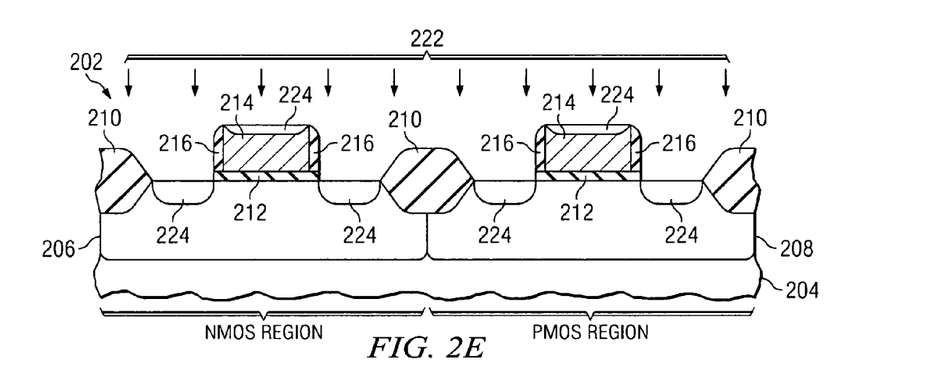
Figure 2F:
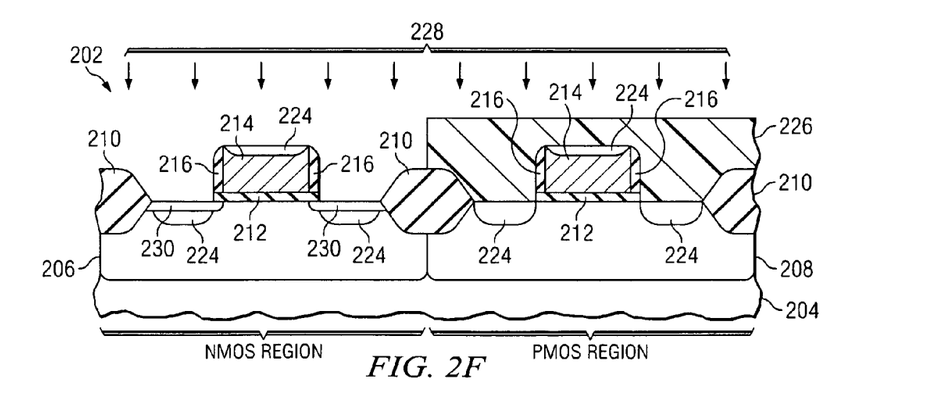

Turning now to FIG. 2E, a deposition process 222 is provided, wherein a carbon doped silicon material 224 is formed on top of the gate electrode 214 (in the recess 220) and also in the recesses 218. As described above, the process 222 may comprise one of many different processes whereby the SiC regions 224 are deposited, made amorphous and subsequently re-crystallized. The PMOS region is then masked off, as illustrated in FIG. 2F with a masking material 226 such as photoresist, and an extension region implant 228 is performed to form n-type extension regions 230 in the NMOS region. A thermal process such as a rapid thermal anneal is then performed to activate the dopant, wherein a lateral diffusion of the extension regions 230 under the offset spacer 216 is achieved.

Figure 2G:
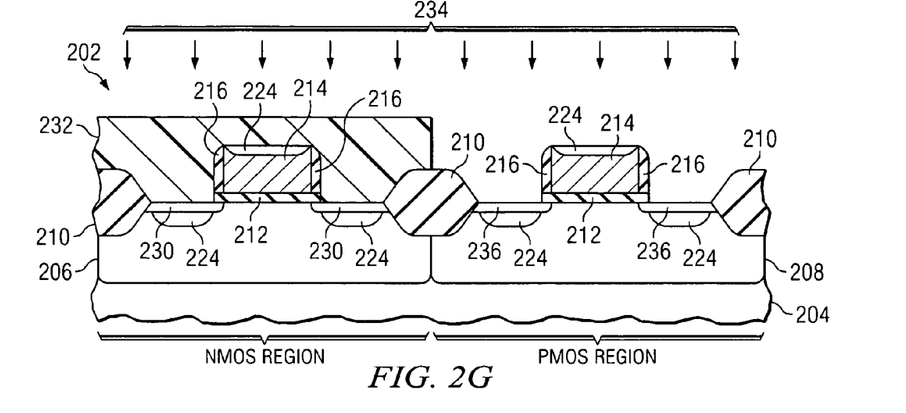
Figure 2H:
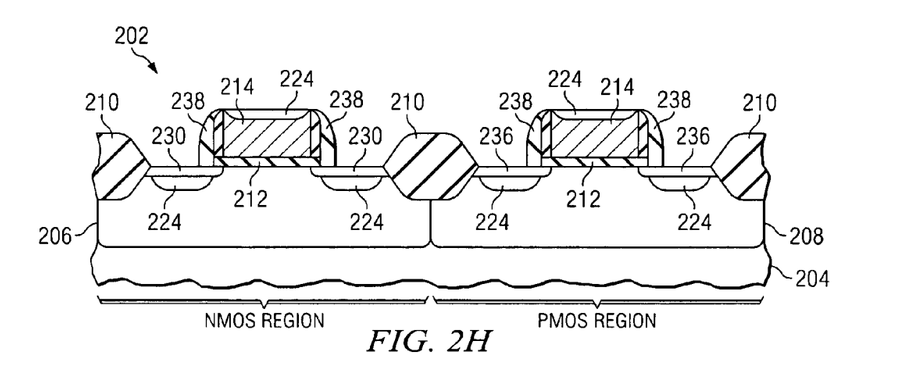

The n-type extension region mask 226 is then removed, and a p-type extension region mask 232 is deposited and patterned to cover the NMOS region, as illustrated in FIG. 2G. A p-type extension region implant process 234 is then performed to form p-type extension regions 236 in the PMOS region, as illustrated. The mask 232 is then removed and sidewall spacers are formed over the offset spacers 216 on the lateral edges of the gate structures. An insulating sidewall material is deposited in a generally conformal manner over the device and subsequently subjected to an anisotropic etch to remove the insulating material on top of the gate and over the active areas, leaving sidewall spacers 238 in both the NMOS and PMOS regions, as illustrated in FIG. 2H.

Figure 2I:
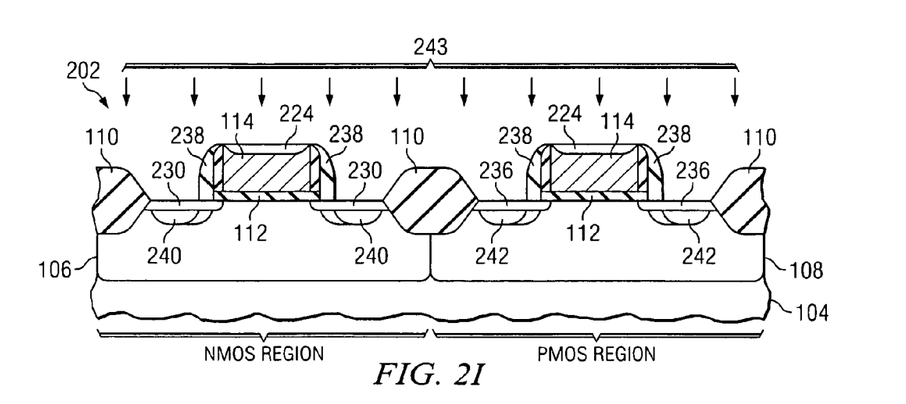

Source and drain regions 240 and 242 are formed in the NMOS and PMOS regions, respectively. As discussed above in conjunction with the extension region implants, the source/drain implants 243 are performed with an NSD mask (not shown) and then a PSD mask (not shown) in order to implant the NMOS region and the PMOS region separately with n-type and p-type dopant, respectively. As can be seen in FIG. 2I, the source/drain regions 240, 242 are self-aligned with respect to the sidewall spacers, and thus are laterally spaced from the extension regions 230, 236 and the carbon doped silicon strain regions 224 nearest the channel (underlying the gate 214).

Figure 2J:
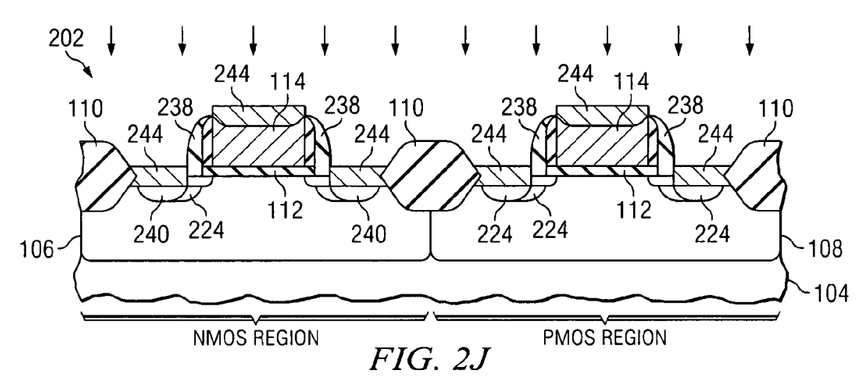

The method then concludes with silicidation, wherein a metal layer is deposited, for example, via sputtering, over the device, followed by a thermal process. During the thermal processing, those regions where the metal contacts silicon reacts to form a metal silicide, as illustrated in FIG. 2J. More particularly, the silicide 244 forms on the source/drain regions and on top of the gates as illustrated. Subsequently, back end processing including metallization may be performed to interconnect the various transistors, as may be desired.

Figure 2K:
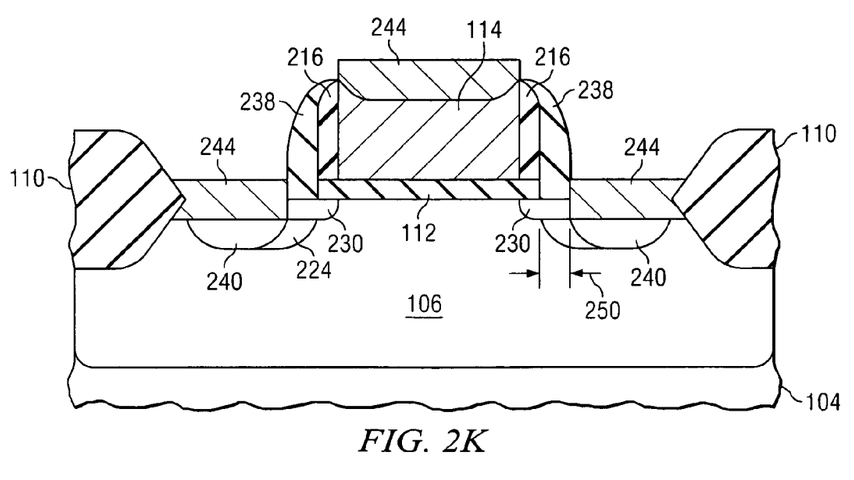

Looking now at FIG. 2K, an enlarged view of the resulting NMOS transistor fabricated in accordance with the invention of FIG. 1 is illustrated. Note that the carbon doped region 224 is substantially closer to the channel than the source/drain regions 240, for example, by a distance 250.

Figure 3:
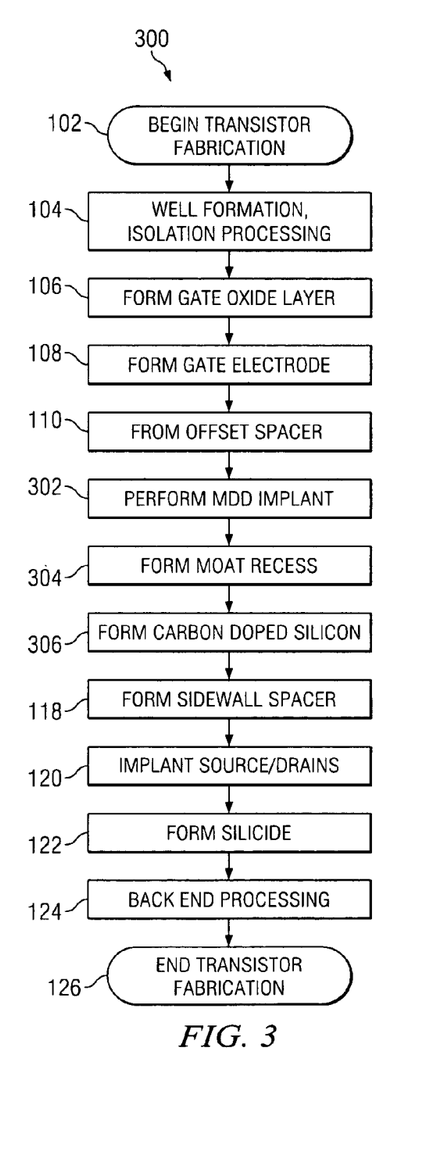
FIG. 3 is a flow chart diagram illustrating a method of forming a transistor having improved mobility according to another aspect of the present invention.

In accordance with another aspect of the invention, FIG. 3 is a flow chart directed to another method of forming a transistor device having improved mobility due to an efficient application of tensile strain to the channel, and is designated at reference numeral 300. The method 300 is similar in many respects to the method 100 of FIG. 1, and with regards to such aspects, those portions will not be repeated again. For example, acts 102–110 may proceed generally in the same manner as method 100. At 302, an extension region implant is performed after the offset spacer has been formed on lateral edges of the gate structure. Recesses are then formed in the active area (and also on top of the gate) at 304 after the extension regions have been formed. A carbon doped silicon material is then formed in the recesses at 306, using one of the processes described herein above, near the channel. The method 300 may then proceed at 118–126 in a manner similar to that of method 100. Consequently, the method 300 indicates that the order in which the extension regions are formed and the recesses are formed may be switched, and either alternative is contemplated as falling within the scope of the present invention.

Figure 4A:
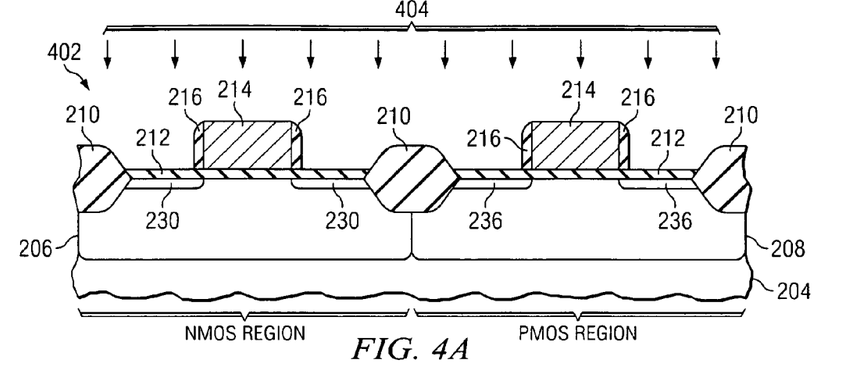
FIGS. 4A–4F are fragmentary cross section diagrams illustrating various steps of forming NMOS and PMOS transistors in accordance with the invention of FIG. 3.

FIGS. 4A–4F illustrate the fabrication of the transistor devices in accordance with the method 300 of FIG. 3. As illustrated in FIG. 4A, a transistor device has NMOS and PMOS regions as before with P-well and N-well regions 206 and 208 formed in a semiconductor body 204. Isolation regions 210 also are provided to define active areas for fabrication of transistor devices. A gate oxide 212 overlies the active regions and a patterned conductive gate electrode 214 is formed thereover. Offset spacers 216 reside on lateral edges of the gate 214 and an extension region implant process 404 (e.g., an n-type followed by a p-type) is provided in conjunction with appropriate masking to form extension regions 230 and 236, respectively. A subsequent thermal anneal causes the extension regions 230 and 236 to diffuse laterally to extend slightly under the offset spacers 216.

Figure 4B:
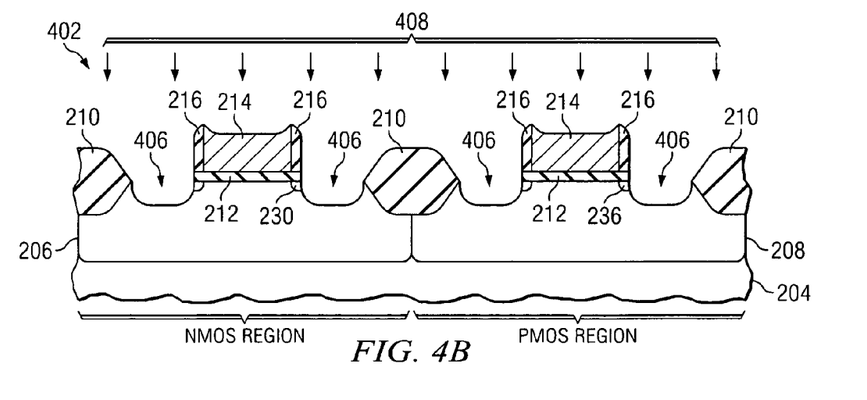
Figure 4C:
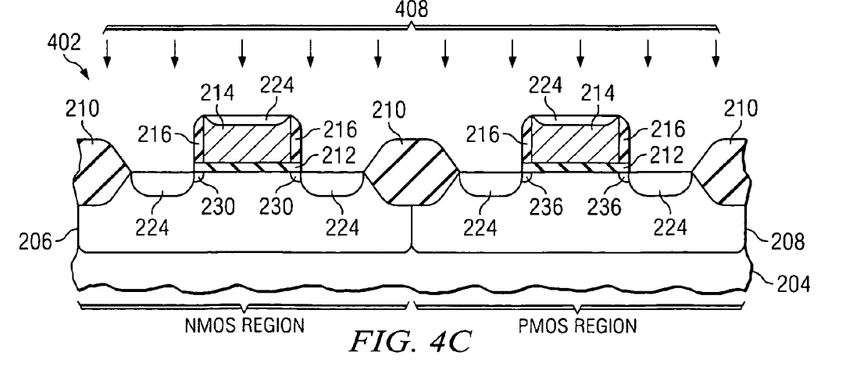

Recesses 406 are then formed in the active areas (and on top of the gate electrodes 214) after the extension region implant via an etch process 406, as illustrated in FIG. 4B. Because the extension regions have diffused slightly under the offset spacers 216 and the recesses are self-aligned with respect to the spacers, small portions of the extension regions remain near the channel, as illustrated. A carbon doped silicon material 224 is then formed in the recesses and on top of the gate electrode as illustrated in FIG. 4C, via one of the processes as described herein above.

Figure 4D:
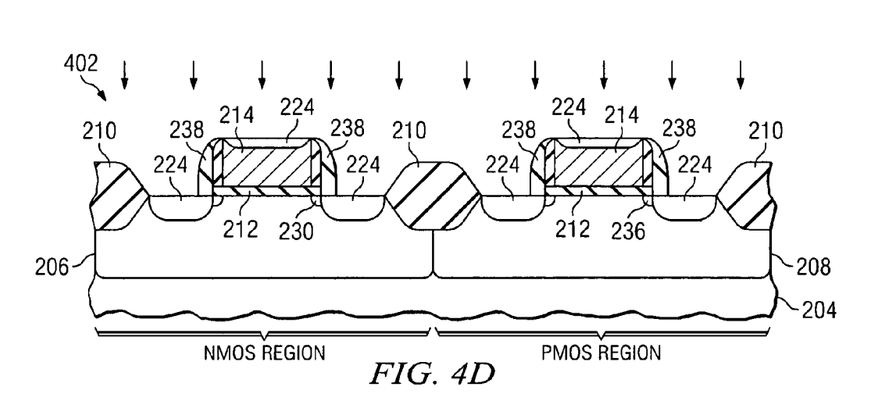
Figure 4E:
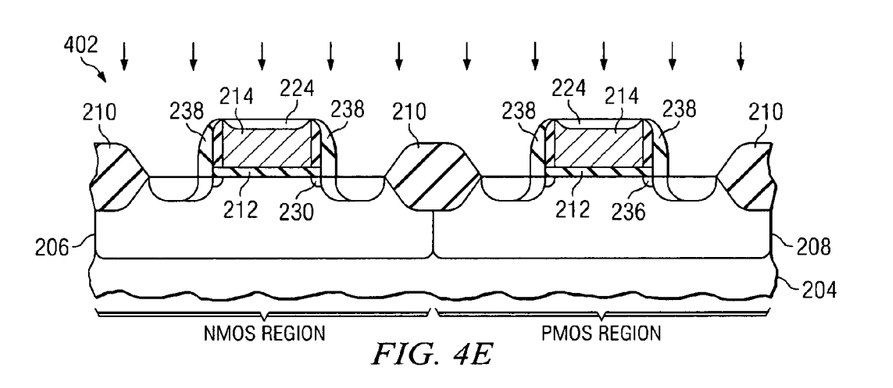
Figure 4F:
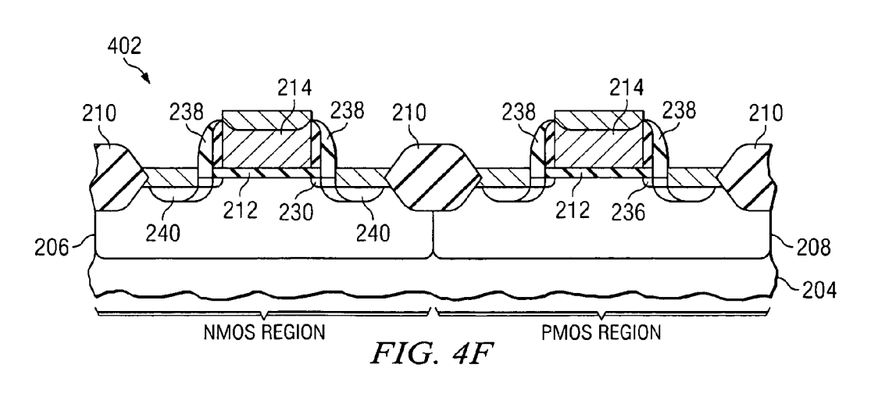

FIGS. 4D–4F progress similarly to that described in the previous method, wherein sidewall spacers are formed, followed by the source/drain implants (in NMOS regions and then PMOS regions, respectively) and then silicidation.

In the methods of FIGS. 1 and 3, the recesses and carbon-doped regions are formed in both the NMOS and the PMOS regions. In accordance with another embodiment of the present invention, the recesses and filling thereof with carbon doped silicon material may be performed solely in the NMOS regions of the device, as will be discussed below and illustrated in conjunction with FIGS. 5 and 6A–6G.

Figure 5:
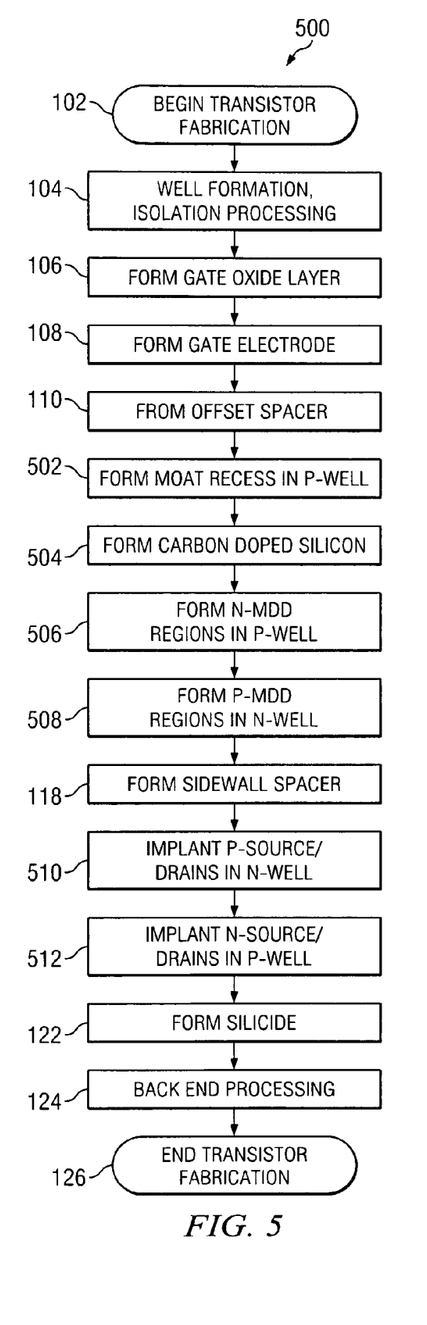
FIG. 5 is a flow chart diagram illustrating a method of forming a transistor having improved mobility according to yet another aspect of the present invention.

Turning now to FIG. 5, a method 500 is disclosed wherein an NMOS transistor is formed in a CMOS process. Steps 102–110 may proceed in a manner similar to that discussed supra. At 502, a moat recess is selectively formed in a P-well (an NMOS region) by masking off the N-well (the PMOS region) and performing a silicon etch after the formation of offset spacers on the gate electrodes. Carbon doped silicon is then formed in the recesses (in the active areas as well as on top of the gate electrode) in the NMOS region at 504 while the mask is maintained on the PMOS region, thereby preventing such material to form therein. SiC region 504 is formed using one of the processes described herein above. N-type extension regions are then formed at 506 with the mask still in place, thereby doping the carbon doped silicon material within the recesses with n-type dopants. A thermal process then causes the n-type dopant to diffuse laterally under the offset spacers, and toward the channel. Alternatively, the n-type extension regions may be formed prior to forming the recesses.

The method 500 continues at 508 by removing the mask in the PMOS region, depositing and patterning another mask over the NMOS region, and performing a p-type extension region implant into the N-well in the PMOS region to form p-type extension regions that are self-aligned with respect to the offset spacers. The mask is then removed and sidewall spacers are formed at 118 over the offset spacers in both the NMOS and PMOS regions. Another mask is deposited and patterned to cover the NMOS region and a p-type source/drain implant is performed 510 therein to form p-type source/drain regions that are self-aligned with respect to the sidewall spacers. The mask is then removed and a second mask is provided to cover the PMOS regions, and an n-type source/drain implant is performed at 512 in the NMOS regions to form n-type source/drain regions therein that are self-aligned with respect to the sidewall spacers. Silicide processing 122 and back end processing 124 may then proceed in a typical manner.

Figure 6A:
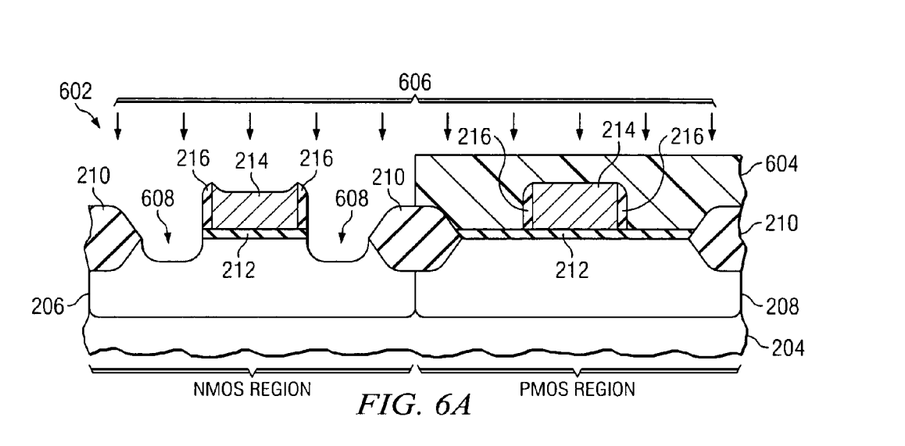
FIGS. 6A–6G are fragmentary cross section diagrams illustrating various steps of forming an NMOS transistor in accordance with the invention of FIG. 5.
Figure 6B:
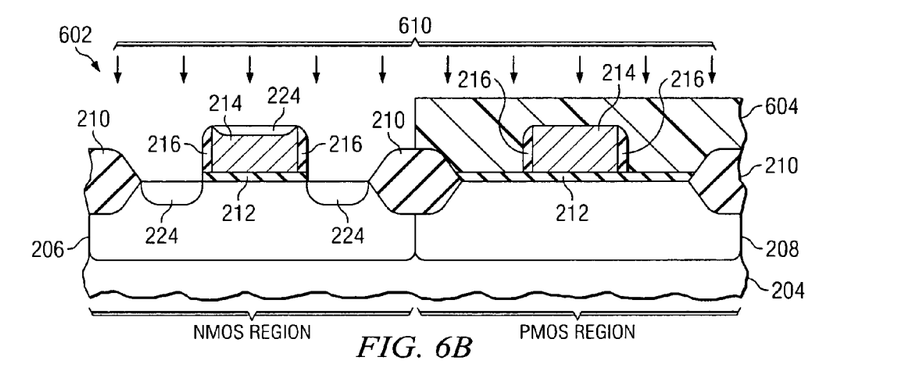
Figure 6C:
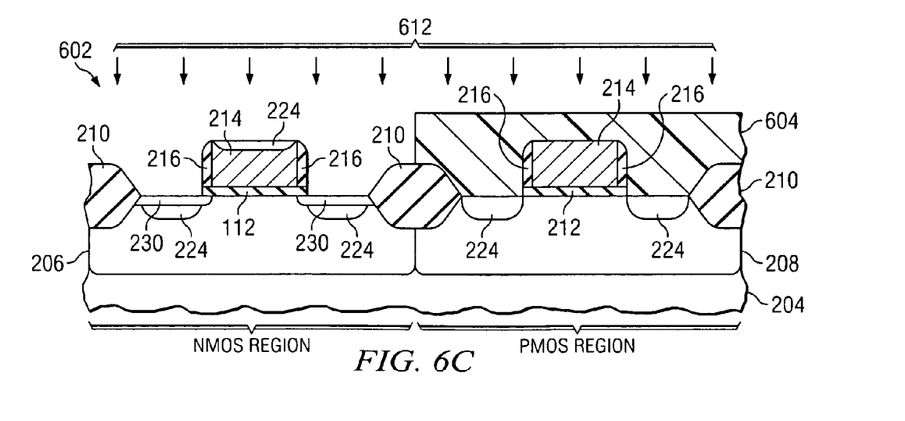

In FIG. 6A, the device 602 is illustrated with a mask 604 over the PMOS region, and an etch process 606 is performed to form the recesses 608 in the active areas defined by the offset spacers 216 and the isolation regions 210, as well as on top of the gate electrode 214 (when the gate comprises polysilicon). In FIG. 6B, a deposition process 610 is performed, wherein a carbon doped silicon, or SiC, region 224 is formed by one of the processes described herein above within the recesses 608 while the mask 604 continues to mask the PMOS region. The NMOS region is then subjected to an n-type extension region implant 612, wherein the n-type extension regions are formed (FIG. 6C). A subsequent thermal anneal causes the extension regions to diffuse laterally slightly under the offset spacers.

Figure 6D:
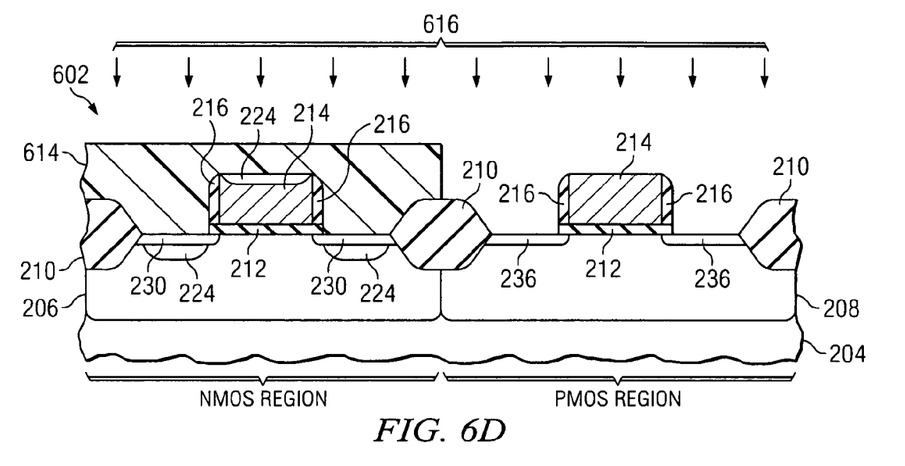
Figure 6E:
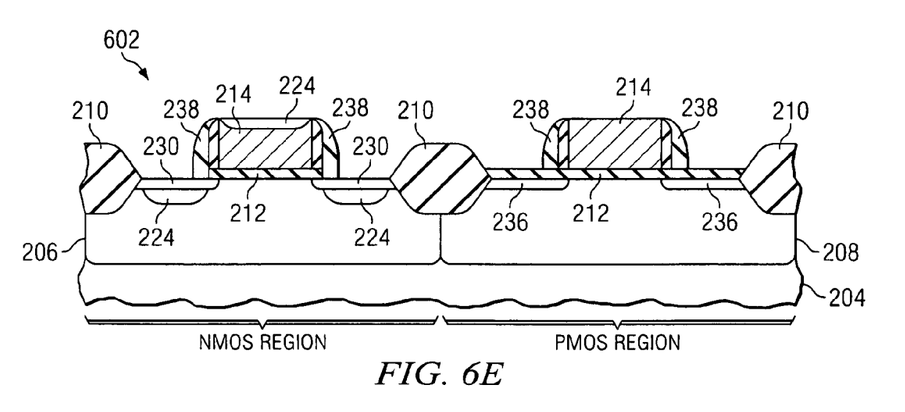
Figure 6F:
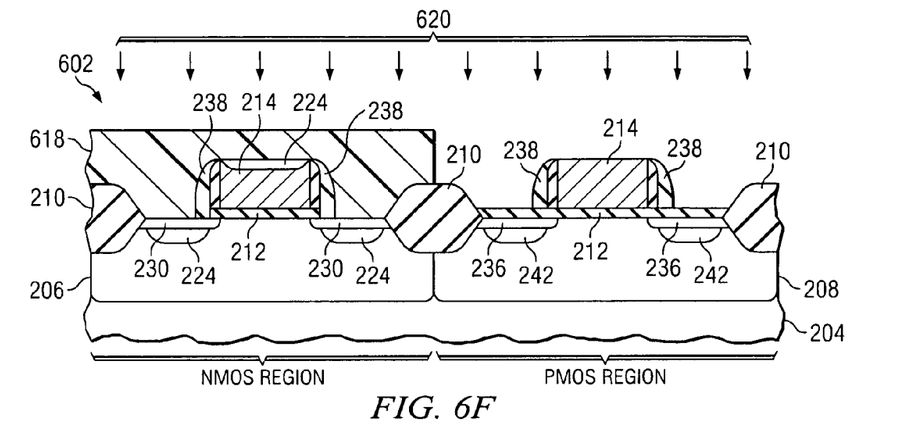
Figure 6G:
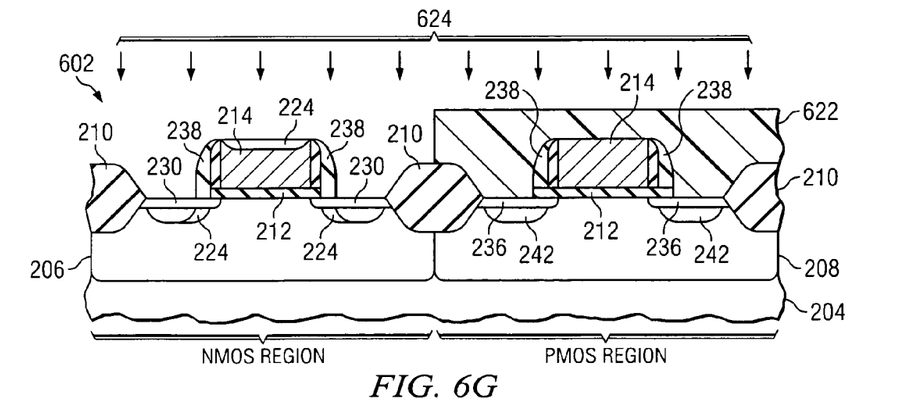

The mask 604 is then removed, and another mask 614 is formed and patterned to overlie the NMOS region, as illustrated in FIG. 6D. A p-type extension region implant 616 is then performed to form p-type extension regions 236 in the PMOS region as shown. The mask 614 is then removed and sidewall spacers 238 are formed over the offset spacers in both the NMOS and PMOS regions, as illustrated in FIG. 6E. Another mask 618 is then formed over the NMOS region (FIG. 6F), and a p-type source/drain implant 620 is performed in the PMOS region to form the source/drain regions 242. The mask 618 is then stripped, and another mask 622 is formed to cover the PMOS region, and an n-type source/drain implant process 624 is provided to form n-type source/drain regions 240, as illustrated in FIG. 6G.

In the above manner, the device may be fabricated with optimized NMOS transistors without incorporating any carbon into and hence affecting the operation of the PMOS devices.

As noted above, any of the elements in Group IVa of the periodic table may be substituted for the carbon in the SiC regions 224 described above. Further, while SiC regions 224 have been shown and described as formed within a recess to create a planar upper surface level with the surrounding structure, it will be understood that the regions may be formed of a thickness to be above or below the surface of the surrounding structure. In yet another embodiment of the invention, the steps of forming the recesses 218, 406 and 608 are omitted (i.e. steps 114, 304 and 504), and the SiC regions are formed directly on the upper surface of the semiconductor structure the source and drain regions subsequently formed therein.

There have thus been provided methods, systems and structures for forming new and improved transistors. The methods include forming an amorphous mix of silicon plus a Group IVa element in source/drain regions proximate the channel of the transistor. Different methods are provided for forming the amorphous and re-crystallized regions. In certain embodiments, the silicon mix is deposited and amorphized, for example through subsequent implantations. In other embodiments, the mix is deposited in an amorphous form. The amorphous mix is re-crystallized, for example through thermal processing. The present inventors have determined the invention to be effective regardless of the precise positioning of the SiC regions relative to the source/drain regions. In different embodiments of the invention the SiC regions are shown in the source/drain regions as well as in the MDD and/or LDD extension regions. The inventors theorize the improved performance results from physical strain providing increased carrier mobility. The resulting transistors exhibit improved operating characteristics in comparison to devices incorporating conventional silicon regions and are simpler to fabricate in comparison to other strained-region devices.

While the invention has been illustrated and described with respect to one or more implementations, alterations and/or modifications may be made to the illustrated examples without departing from the spirit and scope of the appended claims.

What is claimed is:

1. A method of forming a transistor, comprising:
   forming a gate structure over a semiconductor body;
   forming amorphous regions of silicon doped with a Group IVa element aligned to the gate structure in the semiconductor body;
   re-crystallizing the amorphous regions of silicon to form doped substitutional crystalline regions;
   implanting source and drain regions in the doped crystalline regions;
   forming recesses substantially aligned to the gate structure in the semiconductor body; and
   forming the amorphous regions of silicon in the recesses.

2. The method of claim 1, wherein the step of forming amorphous regions of silicon comprises the steps of:
   depositing regions of silicon doped with a Group IVa element; and
   implanting a dopant into the regions of silicon to form the amorphous regions of silicon.

3. The method of claim 1, wherein the step of forming amorphous regions of silicon comprises a gas ion beam deposition of the amorphous regions of silicon.

4. The method of claim 1 wherein the step of re-crystallizing the amorphous regions of silicon includes thermal processing the amorphous regions of silicon.

5. The method of claim 1, wherein the group IVa dopant is carbon and the doped silicon regions contains in the range of about 0.2 atomic percent substitutional carbon to about 2 percent substitutional atomic carbon.

6. The method of claim 1, wherein the recesses have a depth of about 30 nm or more and about 110 nm or less.

7. The method of claim 1, further comprising performing a thermal process after implanting the source and drain regions, wherein the source and drain regions diffuse laterally due to the thermal process.

8. A method of forming an NMOS and a PMOS transistor concurrently, comprising:
   forming a gate structure over a semiconductor body in an NMOS region and a PMOS region, respectively;
   forming recesses substantially aligned to the gate structures in the semiconductor body in both the NMOS and PMOS regions;
   forming amorphous regions of silicon doped with a Group IVa element in the recesses;
   crystallizing the amorphous regions of silicon to form substitutional crystallized regions of silicon;
   forming sidewall spacers over lateral edges of the gate structures; and
   implanting n-type source and drain regions in the NMOS region and p-type source and drain regions in the PMOS region of the semiconductor body after forming the sidewall spacers.

9. The method of claim 8 wherein the step of forming amorphous regions of silicon comprises the steps of:
   depositing regions of silicon doped with a Group IVa element; and
   implanting a dopant into the regions of silicon to form the amorphous regions of silicon.

10. The method of claim 8 wherein the step of forming amorphous regions of silicon comprises a gas ion beam deposition of the amorphous regions of silicon.

11. The method of claim 8 wherein the step of crystallizing the amorphous regions of silicon includes cooling the amorphous regions of silicon.

12. The method of claim 8, further comprising forming offset spacers on the lateral edges of the gate structures before forming the recesses, wherein the recesses are aligned in the semiconductor body with respect to the offset spacers.

13. The method of claim 12, wherein the recesses are offset from the lateral edges of the gate structure a distance of about 10 nm or more and about 50 nm or less.

14. The method of claim 8, further comprising implanting n-type extension regions in the NMOS region and p-type extension regions in the PMOS region into the crystallized silicon regions.

15. The method of claim 8, wherein the group IVa dopant is carbon in the range of about 0.2 atomic percent substitutional carbon to about 2 atomic percent substitutional carbon.

16. The method of claim 8, wherein the recesses have a depth of about 30 nm or more and about 110 nm or less.

17. The method of claim 16, further comprising:
   forming offset spacers on the lateral edges of the gate structures before forming the recesses, wherein the recesses are aligned in the semiconductor body with respect to the offset spacers;
   performing an n-type extension region implant in the NMOS region and a p-type extension region implant in the PMOS region, respectively, after formation of the offset spacers and before forming the recesses; and
   performing a thermal process after the extension region implant and before forming the recesses, wherein the extension regions slightly diffuse laterally in response thereto such that edges thereof extend below the offset spacers toward the respective gate structures.

18. The method of claim 8, further comprising performing a thermal process after implanting the n-type source and drain regions in the NMOS region and the p-type source and drain regions in the PMOS region, respectively, wherein the n-type and p-type source and drain regions diffuse laterally due to the thermal process.

* * * * *